(12) United States Patent
Liao et al.

(10) Patent No.: US 12,581,768 B2
(45) Date of Patent: Mar. 17, 2026

(54) SOLAR CELL AND PHOTOVOLTAIC MODULE

(71) Applicant: Tongwei Solar (Chengdu) Co., Ltd., Chengdu (CN)

(72) Inventors: Chuan Liao, Chengdu (CN); Qin Gan, Chengdu (CN); Yi Yang, Chengdu (CN); Xiajie Meng, Chengdu (CN); Guoqiang Xing, Chengdu (CN)

(73) Assignee: Tongwei Solar (Chengdu) Co., Ltd., Chengdu (CN)

( * ) Notice: Subject to any disclaimer, the term of this patent is extended or adjusted under 35 U.S.C. 154(b) by 0 days.

(21) Appl. No.: 19/030,893

(22) Filed: Jan. 17, 2025

(65) Prior Publication Data
US 2026/0075986 A1 Mar. 12, 2026

(30) Foreign Application Priority Data
Sep. 12, 2024 (CN) .......................... 202411273710.1

(51) Int. Cl.
H10F 77/70 (2025.01)
H10F 77/164 (2025.01)
(Continued)

(52) U.S. Cl.
CPC ....... H10F 77/707 (2025.01); H10F 77/1642 (2025.01); H10F 77/1662 (2025.01); H10F 77/311 (2025.01)

(58) Field of Classification Search
None
See application file for complete search history.

(56) References Cited

U.S. PATENT DOCUMENTS

2014/0360571 A1 12/2014 Ji et al.
2015/0068594 A1 3/2015 Nishiyama et al.
(Continued)

FOREIGN PATENT DOCUMENTS

CN 110034193 A * 7/2019 ............. H10F 71/00
CN 113540269 A 10/2021
(Continued)

OTHER PUBLICATIONS

Machine translation of CN115449900A (Year: 2022).*
(Continued)

*Primary Examiner* — Tamir Ayad
(74) *Attorney, Agent, or Firm* — Scully, Scott, Murphy & Presser, P.C.

(57) ABSTRACT

A solar cell and a photovoltaic module are provided. The solar cell includes a substrate provided with a first face and a second face, at least one of which is a side of the substrate. On shared prismatic edges and/or shared corners where the first surface and the second surface are adjacent, the substrate is also provided with a multiple-pyramid shared body having a shared face. When viewed in the direction towards the first surface, the multiple-pyramid shared body includes a first pyramid structure formed by enclosing several first triangular surfaces and several third triangular surfaces. When viewed in the direction towards the second surface, the multiple-pyramid shared body includes a second pyramid structure formed by enclosing several second triangular surfaces and several third triangular surfaces.

11 Claims, 6 Drawing Sheets

(51) Int. Cl.
      H10F 77/166          (2025.01)
      H10F 77/30           (2025.01)

(56)                    References Cited

U.S. PATENT DOCUMENTS

| | | | |
|---|---|---|---|
| 2017/0077321 A1* | 3/2017 | Ito | C23C 16/401 |
| 2020/0203553 A1 | 6/2020 | Li et al. | |
| 2024/0063313 A1 | 2/2024 | Liu et al. | |
| 2025/0143009 A1* | 5/2025 | Liu | H10F 77/311 |

FOREIGN PATENT DOCUMENTS

| | | | | |
|---|---|---|---|---|
| CN | 115050852 A | | 9/2022 | |
| CN | 115312622 A | * 11/2022 | | H10F 77/311 |
| CN | 115449900 A | * 12/2022 | | C23F 1/32 |
| CN | 115579421 A | | 1/2023 | |
| CN | 113327999 B | | 4/2023 | |
| CN | 117423760 A | | 1/2024 | |
| CN | 117525204 A | | 2/2024 | |
| CN | 118053922 A | | 5/2024 | |
| CN | 118335817 A | | 7/2024 | |
| DE | 102010035582 B4 | | 1/2017 | |
| KR | 20120038625 A | | 4/2012 | |
| KR | 20230118768 A | | 8/2023 | |

OTHER PUBLICATIONS

Machine translation of CN115312622A (Year: 2022).*

Machine translation of CN110034193A (Year: 2019).*

Notification to Grant dated Oct. 21, 2024 issued in CN 202411273710. 1.

Yuxin Xia et al., "Pyramid shape of polymer solar cells: a simple solution to triple efficiency", Journal of Physics D: Applied Physics 46 (2013) 305101, pp. 1-6 doi:10.1088/0022-3727/46/30/305101.

Fei Zhou et al., "Method of monocrystalline silicon pyramid texture measurement based on image processing", Modern Electronics Technique (Aug. 2020), vol. 43 No. 15, DOI: 10.16652/j.issn. 1004 0373x.2020. 15.015.

Extended European search report dated Aug. 29, 2025 received in European Patent Application No. 25154664.4.

Abdullah M.F. et al: "Research and development efforts on texturization to reduce the optical losses at front surface of silicon solar cell", Renewable and Sustainable Energy Reviews, vol. 66, Dec. 1, 2016 (Dec. 1, 2016), pp. 380-398.

Examination report No. 1 dated Dec. 8, 2025 received in Australian Patent Application No. 2025201417.

Notice of Submission of Opinions dated Dec. 9, 2025 received in Korean Patent Application No. 10-2025-0041033.

\* cited by examiner

SOLAR CELL AND PHOTOVOLTAIC MODULE

CROSS-REFERENCE TO RELATED APPLICATION

The application claims priority to Chinese patent application CN 202411273710.1, filed on Sep. 12, 2024, the entire contents of which are incorporated herein by reference for all purposes.

TECHNICAL FIELD

This application relates to the field of a solar cell, and particularly, to a solar cell and a photovoltaic module.

BACKGROUND

A substrate of the solar cell is a core component of the solar cell. However, in current solar cells, the substrate still has defective states that are difficult to eliminate as well as impurity contamination that is hard to completely remove in some positions, among other issues. These problems limit further improvement of photoelectric conversion efficiency of the solar cells.

SUMMARY

In order to solve the above technical problems, this application discloses a solar cell and a photovoltaic module.

In a first aspect, the present application provides a solar cell comprising:

a substrate provided with a first surface and a second surface adjacent to each other on the substrate, at least one of which is a side surface of the substrate;

wherein on shared prismatic edges and/or shared corners where the first surface and the second surface are adjacent, the substrate is further provided with a multiple-pyramid shared body having a shared surface;

wherein when viewed in the direction towards the first surface, the multiple-pyramid shared body comprises a first pyramid structure formed by enclosing several first triangular surfaces and several third triangular surfaces; and when viewed in the direction towards the second surface, the multiple-pyramid shared body comprises a second pyramid structure formed by enclosing several second triangular surfaces and several third triangular surfaces; and wherein the third triangular surface is the shared surface, and the triangular surfaces in the first triangular surface, the second triangular surface and the third triangular surface are in a shape of a triangle or a quasi-triangle.

Furthermore, the multiple-pyramid shared body is a double-pyramid shared body; and wherein the first surface is a first side surface of the substrate, the second surface includes a first subsurface, which is any one of the light-receiving surface, the back surface, and a second side surface of the substrate, and the double-pyramid shared body is provided on the shared prismatic edge at area where the first surface and the first subsurface are adjacent.

Furthermore, the multiple-pyramid shared body is a triple-pyramid shared body; and wherein the first surface is a first side surface of the substrate, the second surface includes a first subsurface and a second subsurface, the first subsurface is the light receiving surface or the back surface of the substrate, the second subsurface is the second side surface adjacent to the first side surface, and the triple pyramid shared body is provided on the shared corner at area where the first surface, the first subsurface, and the second subsurface are adjacent.

Furthermore, the solar cell is a sliced cell, the substrate is provided with a cut side surface, and the side surface of the substrate includes the cut side surface; and/or the first surface and the second surface are perpendicular to each other.

Furthermore, in the orthographic projection of the first surface, the first pyramid structure is provided with a first diagonal with length of L1, and 0.1 $\mu m \leq L1 \leq 7$ $\mu m$;

in the orthographic projection of the second surface, the second pyramid structure is provided with a second diagonal with length of L2, and 0.1 $\mu m \leq L2 \leq 7$ $\mu m$; and in any of the multiple-pyramid shared bodies, $0.5 \leq L1/L2 \leq 2$.

Furthermore, in a direction perpendicular to the first surface, the first pyramid structure is provided with a first height of H1, and 0.1 $\mu m \leq H1 \leq 3$ $\mu m$;

in a direction perpendicular to the second surface, the second pyramid structure is provided with a second height of H2, and 0.1 $\mu m \leq H2 \leq 3$ $\mu m$; and in any of the multiple-pyramid shared bodies, $0.5 \leq H1/H2 \leq 2$.

Furthermore, the multiple-pyramid shared body is arranged along the length direction of the shared prismatic edge; and wherein the shared prismatic edge is provided with a middle region and edge regions located on both sides of the middle region; the length of the diagonal of the multiple-pyramid shared body located in the middle region is less than that of diagonal of the multiple-pyramid shared body located in the edge regions; the height of the multiple-pyramid shared body located in the middle region is less than that of the multiple-pyramid shared body located in the edge regions; and/or, for a region of the length of 100 $\mu m$ corresponding to the shared prismatic edge, the number of the multiple-pyramid shared bodies is greater than or equal to 1.

Furthermore, for the region of the length of 100 $\mu m$ corresponding to the shared prismatic edge, the number of the multiple-pyramid shared bodies is at least 10.

Furthermore, a plurality of third pyramid structures are provided on the first surface, and a plurality of fourth pyramid structures are provided on the second surface.

Furthermore, in the orthographic projection of the first surface, the first pyramid structure is provided with a first diagonal with length of L1, and 0.1 $\mu m \leq L1 \leq 7$ $\mu m$, and the third pyramid structure is provided with a third diagonal with length of L3, and 0.1 $\mu m \leq L3 \leq 7$ $\mu m$, and $0.5 \leq L3/L1 \leq 2$; and wherein in the orthographic projection of the second surface, the second pyramid structure is provided with a second diagonal with length of L2, and 0.1 $\mu m \leq L2 \leq 7$ $\mu m$, and the fourth pyramid structure is provided with a fourth diagonal with length of L4, and 0.1 $\mu m \leq L4 \leq 7$ $\mu m$, and $0.5 \leq L4/L2 \leq 2$.

Furthermore, in the direction perpendicular to the first surface, the first pyramid structure is provided with a first height of H1, and 0.1 $\mu m \leq H1 \leq 3$ $\mu m$, and the third pyramid structure is provided with a third height of H3, and 0.1 $\mu m \leq H3 \leq 5$ $\mu m$, and $0.5 \leq H3/H1 \leq 2$; and wherein in the direction perpendicular to the second surface, the second pyramid structure is provided with a second height of H2, and 0.1 µm≤H2≤3 µm, and the fourth pyramid structure is provided with a fourth height of H4, and 0.1 µm≤H4≤5 µm, and 0.5≤H4/H2≤2.

Furthermore, the solar cell further comprises:

a semiconductor layer located on the light receiving surface and/or back surface of the substrate;

a passivation layer located on a surface of the semiconductor layer facing away from the substrate, and located on the side surface of the substrate; and an electrode.

Furthermore, the solar cell comprises:

the substrate;

a first semiconductor layer and a first electrode sequentially provided in a P-type conductive region on the back surface of the substrate; and a second semiconductor layer and a second electrode sequentially provided in a N-type conductive region on the back surface of the substrate;

wherein, the first semiconductor layer and the second semiconductor layer are alternately arranged in an interdigitated manner, and there is an isolation region between the first semiconductor layer and the second semiconductor layer.

Furthermore, the solar cell further comprises:

a first passivation layer provided on a surface of the first semiconductor layer facing away from the substrate;

a second passivation layer provided on a surface of the second semiconductor layer facing away from the substrate;

a third passivation layer provided on the light receiving surface of the substrate; and a fourth passivation layer provided on the side surface of the substrate.

Furthermore, a first dielectric layer is further provided between the substrate and the first semiconductor layer, and a second dielectric layer is further provided between the substrate and the second semiconductor layer.

Furthermore, the first semiconductor layer is a first doped polycrystalline silicon layer or a first doped amorphous silicon layer deposited on the back surface of the substrate, and the second semiconductor layer is a second doped polycrystalline silicon layer or a second doped amorphous silicon layer deposited on the second dielectric layer; and/or wherein the first passivation layer is one or more layers of aluminum oxide layer, silicon oxide layer, silicon oxynitride layer, or silicon nitride layer, the second passivation layer is one or more layers of aluminum oxide layer, silicon oxide layer, silicon oxynitride layer, or silicon nitride layer, the third passivation layer is one or more layers of aluminum oxide layer, silicon oxide layer, silicon oxynitride layer, or silicon nitride layer, and the fourth passivation layer is one or more layers of aluminum oxide layer, silicon oxide layer, silicon oxynitride layer, or silicon nitride layer; and/or wherein the first dielectric layer is at least one of a silicon oxide layer, an amorphous silicon layer, a polycrystalline silicon layer, and a silicon nitride layer, and the second dielectric layer is at least one of a silicon oxide layer, an amorphous silicon layer, a polycrystalline silicon layer, and a silicon nitride layer.

Furthermore, the solar cell comprises:

the substrate;

a first semiconductor layer and a first electrode sequentially provided on the light receiving surface of the substrate with the first semiconductor layer and the substrate having different conductivity types, respectively; and

a dielectric layer, a second semiconductor layer, and a second electrode sequentially provided on the back surface of the substrate.

Furthermore, the solar cell further comprises:

a fifth passivation layer provided on a surface of the first semiconductor layer facing away from the substrate;

a sixth passivation layer provided on a surface of the second semiconductor layer facing away from the substrate; and a seventh passivation layer provided on the side surface of the substrate.

Furthermore, the first semiconductor layer is formed by thermal diffusion of doped elements into the substrate, or the first semiconductor layer is a first doped polycrystalline silicon layer or a first doped amorphous silicon layer deposited on the light receiving surface of the substrate, and the second semiconductor layer is a second doped polycrystalline silicon layer or a second doped amorphous silicon layer deposited on the dielectric layer; and/or wherein the fifth passivation layer is one or more layers of aluminum oxide layer, silicon oxide layer, silicon oxynitride layer, or silicon nitride layer, the sixth passivation layer is one or more layers of aluminum oxide layer, silicon oxide layer, silicon oxynitride layer, or silicon nitride layer, and the seventh passivation layer is one or more layers of aluminum oxide layer, silicon oxide layer, silicon oxynitride layer, or silicon nitride layer; and/or wherein the dielectric layer is at least one of a silicon oxide layer, an amorphous silicon layer, a polycrystalline silicon layer, and a silicon carbide layer.

In a second aspect, the present application provides a photovoltaic module, wherein the photovoltaic module comprises a solar cell according to the first aspect.

Compared with prior arts, this application possesses at least the following beneficial effects:

The solar cell of an embodiment of the present application, as the above-mentioned multiple-pyramid shared bodies are provided on the shared prismatic edges and/or shared corners where the first surface and the second surface of the substrate are adjacent, is conducive to reducing defective states of the surface of the substrate, further improving cleanliness of the substrate, and minimizing impact of impurity contamination on subsequent processes, thereby is helpful to enhance the photovoltaic conversion efficiency of the solar cell.

BRIEF DESCRIPTION OF FIGURES

To more clearly illustrate technical solutions in embodiments of the present application, a brief introduction to the figures needs to be used in the embodiments will be provided as follows. It is obvious that the figures in the following brief description are only some of the embodiments of the present application. For an ordinary person skilled in the art, other figures can also be obtained from these figures without resorting to creative labor.

DESCRIPTION OF REFERENCE NUMBERS

Figures 1, 2:
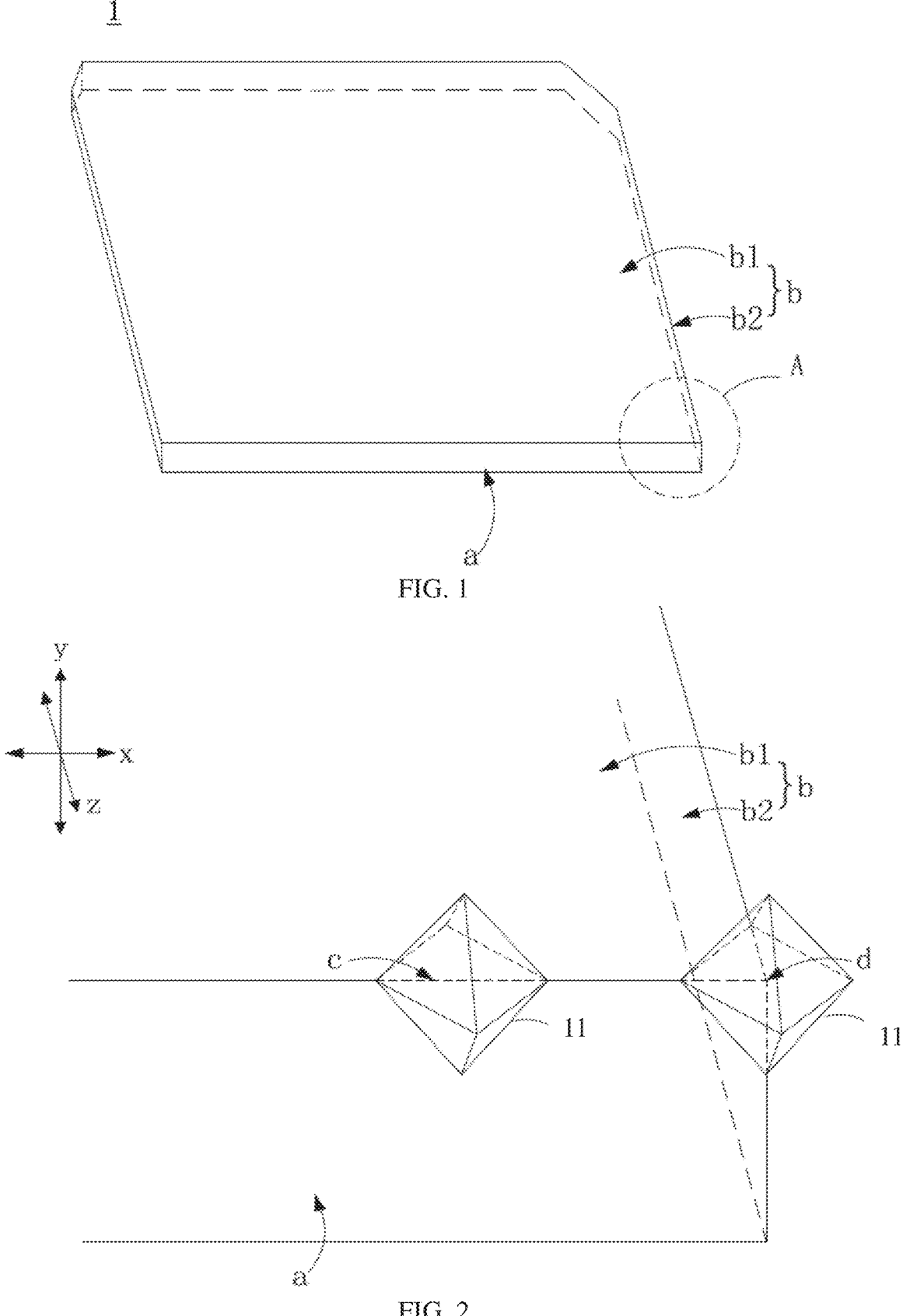
FIG. 1 is a schematic diagram of a structure of a substrate in a solar cell of an embodiment of the present application.
FIG. 2 is an enlarged schematic diagram of the structure at A in FIG. 1.

1. substrate; a. first surface; b. second surface; b1. first subsurface; b2. second subsurface; c. shared prismatic edge; d. shared corner; 11. multiple-pyramid shared body; 111. first pyramid structure; 112. second pyramid structure; 1121. first class of second pyramid; 1122. second class of second pyramid; 12. third pyramid structure; 13. fourth pyramid structure; 11*a*. first triangular surface; 11*b*. second triangular surface; 11*b*1, first class of second triangular surface; 11*b*2, first class of second triangular surface; 11*c*. third triangular surface; 21. first semiconductor layer; 22. second semiconductor layer; 31. first electrode; 32. second electrode; 4. isolation region; 51. first passivation layer; 52. second passivation layer; 53. third passivation layer; 54. fourth passivation layer; 61. first dielectric layer; 62. second dielectric layer.

DETAILED DESCRIPTION OF EMBODIMENTS

The technical solutions in the embodiments of the present application will be described clearly and completely as follows in conjunction with the figures in the embodiments of the present application, and it is obvious that the described embodiments are not all the embodiments, but only a part of the embodiments of the present application. Based on the embodiments in the present application, all other embodiments obtained by an ordinary person skilled in the art without resorting creative labor fall within the protection scope of the present application.

In the present application, terms of "upper", "lower", "left", "right", "front", "back", "top", "bottom", "inner", "outside", "vertical", "horizontal", "transverse", "vertical", etc. indicate an orientation or positional relationship based on that shown in the accompanying drawings. These terms are primarily intended to better describe the present application and its embodiments, and are not intended to limit that the indicated device, element, or component must have a particular orientation, or be constructed and operated in a particular orientation.

Moreover, some of the above terms may be used to indicate other meanings in addition to the orientation or positional relationship, for example, the term "on" may also be used to indicate a certain dependency or connection relationship in some cases. For an ordinary person skilled in the art, the specific meaning of these terms in the present application may be understood according to the specific circumstances.

In addition, terms "mounted", "disposed", "provided with", "connected", and "connected to" shall be understood in a broad sense. For example, it may be a fixed connection, a removable connection, or a monolithic configuration; it may be a mechanical connection or an electrical connection; it may be a direct connection or an indirect connection through an intermediate medium; or it may be an internal communication between two devices, elements or components. To an ordinary person skilled in the art, the specific meaning of the above terms in the present application may be understood according to the specific circumstances.

In addition, terms "first", "second", etc. are not used to indicate or imply the relative importance and number of the indicated devices, elements or components and number, but mainly used to distinguish different devices, elements or components (the specific species and configurations may be the same or different) Unless otherwise indicated, "plurality" means two or more.

The present application provides a solar cell and a photovoltaic module to improve defect states of a substrate of the solar cell and reduce its impurity contamination to a certain degree, so as to further enhance the electrical performance of the solar cell, such as the photovoltaic conversion efficiency and so on, by these improvements.

Figure 3:
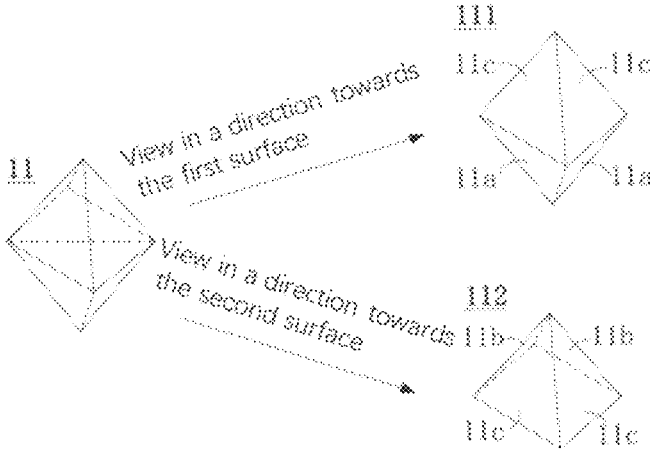
FIG. 3 is a schematic diagram of a structure of a multiple-pyramid shared body in an embodiment of the present application viewed in different directions.

In a first aspect, the present application provides a solar cell, shown in conjunction with FIGS. 1 to 3. FIG. 1 is a schematic diagram of a structure of the substrate 1 in the solar cell of an embodiment of the present application, FIG. 2 is an enlarged schematic diagram of the structure at A in FIG. 1, and FIG. 3 is a schematic diagram of a structure of a multiple-pyramid shared body 11 in an embodiment of the present application viewed in different directions. In order to clearly illustrate structural characteristics of the multiple-pyramid shared body 11, only one multiple-pyramid shared body 11 is illustrated as an example in FIG. 2 for the positions located at shared prismatic edges c and shared corners d, respectively, but the number of the multiple-pyramid shared bodies 11 in the solar cell of the present application is not limited to the example of FIG. 2.

The solar cell of an embodiment of the present application comprises:

a substrate 1, provided with a first surface a and a second surface b adjacent to each other thereon, at least one of which is a side surface of the substrate;

wherein on the shared prismatic edges c and/or shared corners d where the first surface a and the second surface b are adjacent, the substrate 1 is further provided with a multiple-pyramidal shared bodies 11 having a shared surface.

As shown in conjunction with FIGS. 2 and 3, when viewed in the direction towards the first surface a (i.e., when viewed along the z-axis towards the first surface a in FIG. 2), the multiple-pyramid shared body 11 comprises a first pyramid structure 111 formed by enclosing several first triangular surfaces 11*a* and several third triangular surfaces 11*c*; and when viewed in the direction towards the second surface b (i.e., when viewed along the x-axis towards the second surface b in FIG. 2, and/or viewed along the y-axis towards the second surface b in FIG. 2), the multiple-pyramid shared body 11 comprises a second pyramid structure 112 formed by enclosing several second triangular surfaces 11*b* and several third triangular surfaces 11*c*; wherein the third triangular surface 11*c* is a shared surface, and the triangle surfaces in the first triangular surfaces 11*a*, the second triangular surfaces 11*b*, and the third triangular surfaces 11*c* are in a shape of a triangle or a quasi-triangle.

That is to say, the multiple-pyramid shared body 11 in the present application means that there exists such a polyhedral structure on the area where the first surface a and the second surface b are adjacent. When viewed from different viewpoints, the polyhedral structure presents corresponding pyramid structures under different viewpoints, respectively, so as to make it possible to utilize a part of the triangular surfaces in the different pyramid structures as shared surfaces, and thereby form a shared body through the shared surfaces and other triangular surfaces. Since the shared body shares a part of the surfaces in the different pyramidal structures, the shared body is a multiple-pyramid shared body 11. For example, a shared body obtained by utilizing the shared surfaces of two pyramidal structures, which can be viewed at two different viewpoints, is known as a double-pyramid shared body; and a shared body obtained by utilizing the shared surfaces of three pyramidal structures, which can be viewed at three different viewpoints, is known as a triple-pyramid shared body.

Figure 4:
FIG. 4 is a schematic diagram of variant structures of a triangular surface in an embodiment of the present application.
Figure 4:
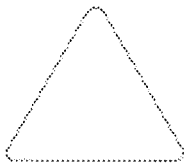
Figure 4:
Figure 4:

Among them, the pyramidal structure viewed at any of the viewpoints is formed by enclosing several triangular surfaces. These triangular surfaces each can be in shape of a standard triangle or a quasi-triangle. Quasi-triangles are those whose overall shape is close to that of a standard triangle, due to defects such as tiny pits exit on some surfaces of the pyramid structures, hence the triangular surfaces used to be enclosed forming the pyramid structures may be in a shape of the aforementioned quasi-triangle. For example, FIG. 4 shows several alternative triangular surfaces, in which the corners of a triangle may be a sharp corner or a curved corner, and small pits may be present on the corners or sides of the triangles, but the overall shape of which is still generally triangular, and so on. The overall shape of the pyramid structure formed by enclosing these triangular surfaces should also be broadly construed as the shape of these pyramid structures may be standard pyramid shape or a shape that approximates a pyramid in its overall profile.

Among them, when recites that the pyramid structures are formed by enclosing several triangular surfaces, it means that the outer surfaces of the pyramid structures are formed by enclosing these triangular surfaces. As for the bottom surfaces of the pyramid structures, although there do not exist actual structural surfaces of the bottom surfaces, the bottom surfaces can be understood as orthographic projection surfaces of the pyramid structure on the corresponding surfaces. Taking the first pyramid structure 111 as an example, when viewed in the direction toward the first surface a (i.e., observing along the z-axis towards the first surface a in FIG. 2), only the first triangular surface 11a and the third triangular surface 11c which are used to be enclosed to form the outer surface of the first pyramid structure 111 can be seen, and the bottom surface of the first pyramid structure 111 is practically unable to be seen. However, parameters such as shape and sizes of the bottom surface of the first pyramid structure 111 can be determined by the orthographic projection of the shape formed by enclosing the first triangular surface 11a and the third triangular surface 11c on the first surface a.

In addition, a pyramid structure refers to a structure having the same or similar shape as a pyramid, and thus the pyramid structure of the present application is not a planar structure, but a three-dimensional structure. In the case of the first pyramid structure 111, for example, although it can be seen by viewing it in the direction towards the first surface a, it can also be observed by means of the scanning electron micrograph that there exists a shared center point for the first triangular surface 11a and the third triangular surface 11c used to be enclosed to form the first pyramid structure 111, and the first pyramid structure 111 is in fact a three-dimensional structure, rather than a planar structure.

In addition, the first triangular surface 11a in the present application refers to the triangular surface located on the first surface a, the second triangular surface 11b refers to the triangular surface located on the second surface b, and the third triangular surface 11c is located on both the extension surface of the first surface a and the extension surface of the second surface b, and hence is a shared surface. Thus, it can also be understood that the main difference among the first triangular surface 11a, the second triangular surface 11b, and the third triangular surface 11c in the present application lies mainly in that the surfaces on which they are located are in different positions.

The solar cell of an embodiment of the present application contributes to further enhancement of the photovoltaic conversion efficiency of the solar cell, due to the above-described multiple-pyramidal shared bodies 11 provided on the shared prismatic edge c and/or shared corner d where the first surface a and the second surface b of the substrate 1 are adjacent, which is conducive to reducing the defective states on the surfaces of the substrate 1, and to improving the cleanliness of the substrate 1 so as to minimize impacts brought by contamination of impurities on subsequent process.

Firstly, if the pyramid structures are only provided on the first surface a or the second surface b, and the multiple-pyramid shared bodies 11 are not formed at the area where the two surfaces are adjacent, there will be more defective states and a certain amount of hanging bonds in the substrate 1 at the area where the two adjacent surfaces are adjacent, which is likely to lead to recombination. However, in the present application, multiple-pyramid shared bodies 11 are provided at the area where two surfaces are adjacent, which is conducive to reducing the defective states at that position and reducing the presence of hanging bonds, and thereby reducing the recombination. Not only that, the existence of the multiple-pyramid shared bodies 11 also helps to enhance stability of the mechanical structure of the substrate 1 at the shared prismatic edge c, so that the shared prismatic edge c is less prone to be physically damaged during the processing of the solar cell, which in turn helps to improve durability and reliability of the solar cell.

Secondly, the multiple-pyramid shared body 11 has a smaller overall surface area due to presence of a shared surface, which is beneficial to improve cleanliness of the substrate 1. Specifically, in the case that a multiple-pyramid shared body 11 is a double-pyramid shared body, compared to the total surface area of two separate pyramids with 8 triangular surfaces in total, the double-pyramid shared body has only 6 triangular surfaces, with 2 triangular surfaces reduced, and thus has a smaller surface area. The characteristic of smaller overall surface area of the multiple-pyramid shared body 11 helps to reduce possibility of impurity pollutants accumulating on the surface of the substrate 1, especially in gaps and corner areas near the shared prismatic edges c, while ensuring the light utilization efficiency.

It can be seen in the present application, by providing multiple-pyramid shared bodies 11 at the area where the first surface a and the second surface b are adjacent, a pluralities of benefits, such as reducing defect states, improving structural stability, and increasing cleanliness can be brought to the substrate 1 of the solar cell, which can in turn improve degree of adhesion of functional layers such as passivation layers and reflection-reducing layers that are subsequently fabricated on the substrate 1, hence is conducive to further improving passivation capability of the solar cell and optimizing performance of the solar cell.

As an alternative embodiment, in conjunction with FIG. 2 and FIG. 3, the multiple-pyramid shared body 11 is a double-pyramid shared body. In this embodiment, the double-pyramid shared body can be formed by two adjacent surfaces and their shared prismatic edge c. Among them, the first surface a is a first side surface of the substrate 1, and the second surface b includes a first subsurface b1. The first subsurface b1 is any one of the light receiving surface, back surface, or a second side surface of the substrate 1. A double-pyramid shared body is provided on the shared prismatic edge c located at the area where the first surface a and the first subsurface b1 are adjacent. The structural feature of the double-pyramid shared body being formed at the area where the two surfaces are adjacent is beneficial to optimize a reflection path of light, allowing more light to be effectively guided to the body of the substrate 1 and ensuring utilization rate of light.

For example, in one case where the first subsurface b1 is the light receiving surface or the back surface of the substrate 1, the above-mentioned double-pyramid shared body is formed on the shared prismatic edge c at the area where the first side surface and the light receiving surface (or back surface) are adjacent. An advantage of this structure is that although the side surface of the solar cell is usually not directly exposed to sunlight, forming the above mentioned shaped double-pyramid shared body between the side surface and the light receiving surface (or back surface) is equivalent to creating an additional light absorption area on the side surface of the substrate 1, which is conducive to increasing light scattering, reducing light reflection, improving utilization of the side surface for reflecting light, and further increasing utilization rate of light.

In another case where the first subsurface b1 is a second side surface of the substrate 1, forming the aforementioned double-pyramid shared body on the shared prismatic edge c at the area where the first side surface and the second side surface are adjacent. Advantages of this structure lie in that it facilitates redirection of light reflected by the side surfaces back to the light receiving surface, reduces light leakage from the side surfaces, and ensures that more light can be absorbed and utilized by the cell. In addition, compared to the case where the multiple-pyramid shared bodies 11 are not provided at the shared prismatic edge c, the double-pyramid shared bodies located at the shared prismatic edge c are also conducive to improvement of structural stability of the substrate 1, and provide a better resistance to mechanical stresses during manufacturing process of the solar cell.

As an alternative embodiment, as shown in FIG. 2, the multiple pyramid shared body 11 is a triple-pyramid shared body. In this embodiment, the triple-pyramid shared body can be formed by three adjacent surfaces and their shared corner d. Among them, the first surface a is a first side surface of the substrate 1, and the second surface b includes a first subsurface b1 and a second subsurface b2. The first subsurface b1 is the light receiving surface or back surface of the substrate 1, and the second subsurface b2 is a second side surface adjacent to the first side surface. A tripe-pyramid shared body is formed on the shared corner d located at the area where the first surface a, the first subsurface b1, and the second subsurface b2 are adjacent. The triple pyramid shared body refers to a shared body formed by the three pyramid structures viewed from three different perspectives that possess partially shared triangular surfaces.

The structure of the triple-pyramid shared body will be further described below in relation to FIGS. 2 and 5. Viewed in a direction towards the first surface a (i.e., towards the first surface a in the direction of the z-axis in FIG. 2), the triple-pyramid shared body comprises a first pyramid structure 111 enclosed by a first triangular surface 11a and a plurality of third triangular surfaces 11c. Viewed in a direction towards the light receiving surface (i.e., towards the light receiving surface in the direction of y-axis in FIG. 2), the triple-pyramid shared body comprises a second pyramid 1121 of a first class enclosed by second triangular surfaces 11b1 of a first class and a number of third triangular surfaces 11c. Viewed in a direction towards the second surface (i.e., towards the second surface in the direction of the x-axis in FIG. 2), the triple-pyramid shared body comprises a second pyramid 1122 of a second class enclosed by a number of second triangular surfaces 11b2 of a second class and a number of third triangular surfaces 11c. Among them, the first triangular surfaces 11a refer to triangular surfaces positioned on the first surface a, the second triangular surfaces 11b1 of the first class refer to triangular surfaces positioned on the first subface b1 of the second surface b, the second triangular surfaces 11b2 of the second class refer to triangular surfaces positioned on the second subface b2 of the second surface b, and the third triangular surfaces 11c refer to triangular surfaces positioned simultaneously on an extended surface of the first surface a, an extended surface of the first subsurface b1, and an extended surface of the second subsurface b2, and hence the third triangular surfaces 11c are shared surfaces.

Compared to the three pyramid structures provided individually, the triple-pyramid shared body, provided at the area where the three surfaces are adjacent, has more shared surfaces, and hence the surface area is smaller, which is more conducive to reducing defective states of the substrate 1 and improving cleanliness of surfaces of the substrate 1.

Furthermore, the solar cell may be a solar cell in a whole piece or a solar cell in a sliced piece. When the solar cell is a solar cell in a sliced piece, the solar cell has a cut side surface in the substrate 1 due to a slicing operation. The side surfaces of the substrate 1 include the cut side surface. It will be appreciated that the side surfaces of the substrate 1 may include both the cut side surface and other side surfaces. The multiple-pyramid shared body 11 may be located on a shared prismatic edge c and/or a shared corner d of the cut side surface and the light receiving surface, the back surface, or other side surfaces adjacent thereto. In addition, after the slicing operation is performed on the solar cell, a post-processing operation such as texturing or the like may be performed on side surfaces at cut places to form a multiple-pyramid shared body 11 at areas where the cut surfaces and their adjacent surfaces are adjacent.

After slicing the solar cell in a whole piece, at positions of the cut side surfaces, there are damages to a certain extent, resulting in more defective states and more hanging bonds, and hence there tends to be more severe problems of recombination on the cut side surfaces. Providing multiple-pyramid shared bodies 11 at a shared prismatic edge c and/or a shared corner d of the cut side surface and its adjacent surfaces, it is possible to better solve problems of more defective states on the cut side surfaces due to the slicing operation.

Furthermore, the first surface a and the second surface b are perpendicular to each other.

Following is an explanatory description for each pyramid structure.

In an orthographic projection to the first surface a, the first pyramidal structure 111 is provided with a first diagonal with length of L1, and 0.1 μm≤L1≤7 μm; viewed in the orthographic projection to the second surface b, the second pyramidal structure 112 is provided with a second diagonal with length of L2, and 0.1 μm≤L2≤7 μm; and in any one of the multiple-pyramid shared bodies 11, 0.5≤L1/L2≤2.

The length of L1 of the first diagonal is an average of lengths of the diagonals on the bottom surface of the first pyramid structure 111. For example, when the bottom surface of the first pyramid structure 111 is a rectangle that includes two diagonals, the length of L1 of the first diagonal is an average of the lengths of the two diagonals. Exemplarily, L1 may be 0.1 μm, 0.2 μm, 0.5 μm, 1 μm, 2 μm, 3 μm, 5 μm, or 7 μm. The length of L2 of the second diagonal is an average of the lengths of the diagonals on the bottom surface of the second pyramid structure 112. Exemplarily, L2 may be 0.1 μm, 0.2 μm, 0.5 μm, 1 μm, 2 μm, 3μ, 5 μm, or 7 μm. Exemplarily, L1/L2 may be 0.5, 0.8, 0.9, 1, 1.1, 1.2, 1.5, or 2.

With the lengths of the diagonals of the pyramid structures in both directions in the above ranges and the ratio of the two controlled within the above ranges, the overall dimensional difference between one single multiple-pyramid shared body 11 and another is relatively small. In particularly, when the ratio of L1/L2 tends to be close to 1 (e.g., when L1/L2 is 0.8 to 1.2), it reflects a better overall dimensional uniformity of the single multiple-pyramid shared body 11. This is firstly conducive to better light utilization, and secondly to subsequent deposition of functional layers, such as passivation layers, on the substrate 1 with better adhesion.

In a direction perpendicular to the first surface a, the first pyramidal structure 111 is provided with a first height of H1, wherein 0.1 μm≤H1≤3 μm; in a direction perpendicular to the second surface b, the second pyramidal structure 112 is provided with a second height of H2, wherein 0.1 μm≤H2≤3 μm; and, in any of the multiple-pyramid shared bodies 11, 0.5≤H1/H2≤2. Exemplarily, H1 is 0.1 μm, 0.2 μm, 0.5 μm, 1 μm, 1.5 μm, 2 μm, or 3 μm. Exemplarily, H2 is 0.1 μm, 0.2 μm, 0.5 μm, 1 μm, 1.5 μm, 2 μm, or 3 μm. Exemplarily, H1/H2 is 0.5, 0.8, 0.9, 1, 1.1, 1.2, 1.5 or 2.

With the heights of the pyramidal structure in both directions being in the above ranges as well as the ratio of the two controlled within the above ranges, the overall height difference between one single multiple-pyramid shared body 11 and another is relatively small. In particularly, when the ratio of H1/H2 tends to be close to 1 (e.g., when H1/H2 is 0.8 to 1.2), it reflects a better overall height uniformity of the single multiple-pyramid shared body 11. This better height uniformity and relatively small differences in different directions are conducive to ensuring quality of film formation when subsequently depositing functional layers, such as passivation layers, on the substrate 1, and are conductive to reducing probability of bursting of the functional layers due to large height differences among the multiple-pyramid shared bodies 11 in different directions.

Furthermore, the multiple-pyramid shared bodies 11 are arranged along the length direction of the shared prismatic edge c. The shared prismatic edge c is provided with a middle region and edge regions located on both sides of the middle region. The lengths of the diagonals of the multiple-pyramid shared bodies 11 located in the middle region are smaller than those of the multiple-pyramid shared bodies 11 located in the edge regions, and the heights of the multiple-pyramid shared bodies 11 located in the middle region are smaller than those of the multiple-pyramid shared bodies 11 located in the edge regions.

The multiple-pyramid shared body 11 on the shared prismatic edge c features relatively smaller sizes and heights in the middle area and relatively larger sizes and heights in the edge area. Compared to the middle area, the edge areas of the substrate 1 are more prone to absorbing dirt, with problems of cleaning more difficult to be solved. The sizes and heights of the multiple-pyramid shared bodies 11 in the edge areas are relatively larger, which is more conducive to solving the problems of dirt and contamination on the substrate 1 in the edge areas, and hence resulting improved cleanliness.

For the region of the length of 100 μm corresponding to the shared prismatic edge c, the number of the multiple-pyramid shared bodies 11 is greater than or equal to 1. Preferably, for the region of the length of 100 μm corresponding to the shared prismatic edge c, the number of multiple-pyramid shared bodies 11 is at least 10, and preferably 10 to 20.

Below is an explanation for the first surface a and the second surface b of the pyramid structure.

Figures 5, 6:
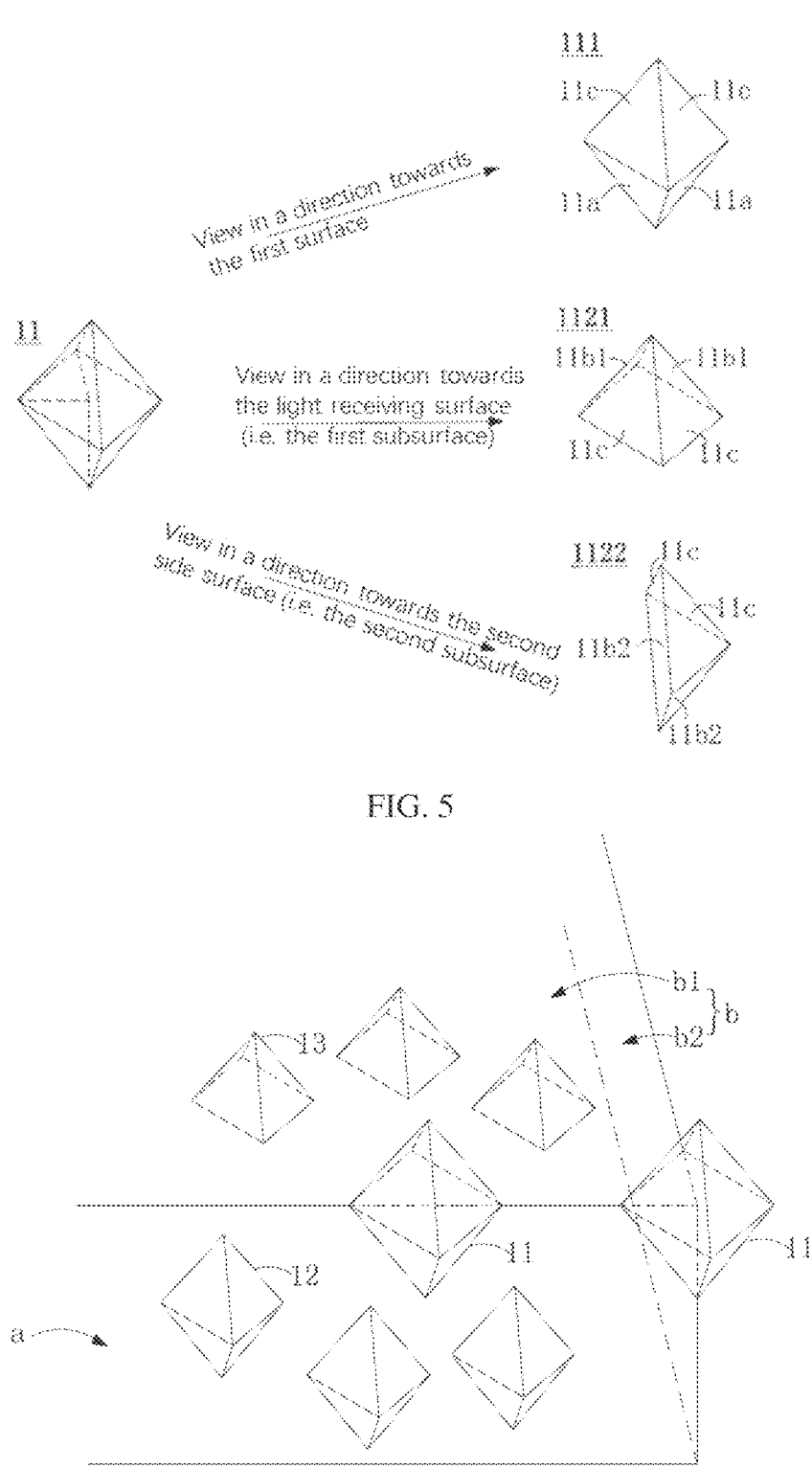
FIG. 5 is a schematic structural diagram of another multiple-pyramid shared body in embodiments of the present application viewed in different directions.
FIG. 6 is a schematic structural diagram of pyramid structures provided in a first surface and a second surface in an embodiment of the present application.

In addition to providing multiple-pyramid shared bodies 11 on the area where the first surface a and the second surface b are adjacent, the present application also provides several third pyramid structures 12 on the first surface a and several fourth pyramid structures 13 on the second surface b, as shown in FIG. 6.

Due to at least one of the first surface a and the second surface b being a side surface of the substrate 1, providing pyramid structures on that surface helps to increase light absorption and utilization efficiency. In addition, providing pyramid structures on that surface can also work together with the multiple-pyramid shared body 11 to improve adhesion when setting functional layers (such as passivation layers) on the substrate 1, in order for the functional layers to provide better effect.

Furthermore, in the orthographic projection of the first surface a, the first pyramid structure 111 is provided with a first diagonal of length of L1, and 0.1 μm≤L1≤7 μm, and the third pyramid structure 12 is provided with a third diagonal with length of L3, and 0.1 μm≤L3≤7 μm, 0.5≤L3/L1≤2. The length of L3 of the third diagonal refers to an average diagonal length on the bottom surface of the third pyramid structure 12. For example, L3 is 0.1 μm, 0.2 μm, 0.5 μm, 1 μm, 2 μm, 3 μm, 5 μm, or 7 μm. For example, L3/L1 is 0.5, 0.8, 0.9, 1, 1.1, 1.2, 1.5, or 2.

In the orthographic projection of the second surface b, the second pyramid structure 112 is provided with a second diagonal with length of L2, and 0.1 μm≤L2≤7 μm, and the fourth pyramid structure 13 is provided with a fourth diagonal with length of L4, and 0.1 μm≤L4≤7 μm, 0.5≤L4/L2≤2. The length of L4 of the fourth diagonal refers to the average of the lengths of the diagonals on the bottom surface of the fourth pyramid structure 13. For example, L4 is 0.1 μm, 0.2 μm, 0.5 μm, 1 μm, 2 μm, 3 μm, 5 μm, or 7 μm. For example, L4/L2 is 0.5, 0.8, 0.9, 1, 1.1, 1.2, 1.5, or 2.

When the lengths of the diagonals of the first pyramid structure 111 and the third pyramid structure 12 are within the above range and ratio, and the lengths of the diagonals of the second pyramid structure 112 and the fourth pyramid structure 13 are within the above range and ratio, the differences among overall sizes of these pyramid structures on the first surface a, the second surface b, and the areas where the first surface a and the second surface b are adjacent are relatively smaller, reflecting better uniformity of the overall sizes of the pyramid structures at different positions. This can reduce problems of more defects of grooves between pyramid structures due to large differences in sizes, thereby reducing risks of increased defects and contamination of impurities.

Furthermore, in the orthographic projection of the first surface a, that is, in the direction perpendicular to the first surface a, the first pyramid structure 111 is provided with a first height of H1, and 0.1 μm≤H1≤3 μm, and the third pyramid structure 12 is provided with a third height of H3, and 0.1 μm≤H3≤5 μm, 0.5≤H3/H1≤2. For example, H3 is 0.1 μm, 0.5 μm, 1 μm, 1.5 μm, 2 μm, 3 μm, 4 μm, or 5 μm. For example, H3/H1 is 0.5, 0.8, 0.9, 1, 1.1, 1.2, 1.5, or 2.

In the orthographic projection direction of the second surface b, that is, in the direction perpendicular to the second surface b, the second pyramid structure 112 is provided with a second height of H2, and 0.1 μm≤H2≤3 μm, and the fourth pyramid structure 13 is provided with a fourth height of H4, and 0.1 μm≤H4≤5 μm, 0.5≤H4/H2≤2. For example, H4 is 0.1 μm, 0.5 μm, 1 μm, 1.5 μm, 2 μm, 3 μm, 4 μm, or 5 μm. For example, H4/H2 is 0.5, 0.8, 0.9, 1, 1.1, 1.2, 1.5, or 2.

When the heights of the first pyramid structure 111 and the third pyramid structure 12 are within above ranges and ratios, and the heights of the second pyramid structure 112 and the fourth pyramid structure 13 are within the above ranges and ratios, differences among the overall heights of these pyramid structures on the first surface a, the second surface b, and the area where the first surface a and the second surface b are adjacent are relatively smaller, reflecting better uniformity in the overall heights of the pyramid structures at different positions.

Below is an explanation of other structures of the solar cell in the embodiments of the present application.

The solar cell of the present embodiments further includes:

a semiconductor layer, located on the light receiving surface and/or back surface of the substrate 1;

a passivation layer, located on a surface of the semiconductor layer facing away from the substrate 1, and located on the side surface of substrate 1; and an electrode.

Among them, the electrode can penetrate the passivation layer and form ohmic contact with the semiconductor layer.

Figure 7:
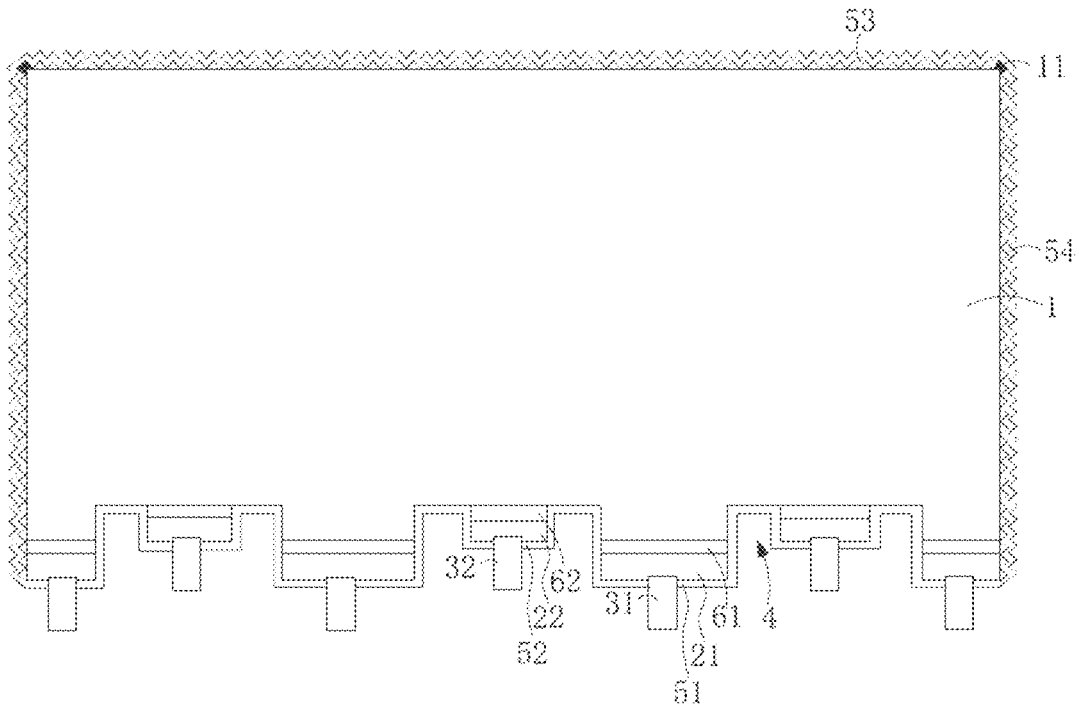
FIG. 7 is a schematic structural diagram of a back-contact solar cell of an embodiment of the present application.

As an alternative embodiment, as shown in FIG. 7, the solar cell is a back contact solar cell. The solar cell comprises:

the substrate 1;

a first semiconductor layer 21 and a first electrode 31 sequentially provided in a P-type conductive region on the back surface of substrate 1; and a second semiconductor layer 22 and a second electrode 32 sequentially provided in a N-type conductive region on the back surface of the substrate 1;

wherein the first semiconductor layer 21 and the second semiconductor layer 22 are alternately arranged in an interdigitated manner, and there is an isolation region 4 between the first semiconductor layer 21 and the second semiconductor layer 22.

Furthermore, the solar cell further comprises:

a first passivation layer 51 provided on a surface of the first semiconductor layer 21 facing away from the substrate;

a second passivation layer 52 provided on a surface of the second semiconductor layer 22 facing away from the substrate;

a third passivation layer 53 provided on the light receiving surface of the substrate 1; and a fourth passivation layer 54 provided on the side surface of the substrate 1.

It can be understood that since both the first semiconductor layer 21 and the second semiconductor layer 22 are provided on the back surface of the substrate 1, the first passivation layer 51 and the second passivation layer 52 can be provided on the first semiconductor layer 21 and the second semiconductor layer 22 respectively. Alternatively, the first passivation layer 51 and the second passivation layer 52 can be provided as a whole passivation layer on the entire back surface, covering both the first semiconductor layer 21 and the second semiconductor layer 22, as well as the isolation region 4 on the substrate 1.

Since the shared prismatic edges c and/or shared corners d of the light receiving surface and the side surface of the substrate 1 is provided with the above-described multiple-pyramid shared bodies 11 having shared surfaces, and third pyramid structures 12 are provided on the side surfaces, improvement of results of adhesion of the fourth passivation layer 54 provided on the side surfaces to the substrate 1 is facilitated, which in turn enhances passivation performance of the fourth passivation layer 54.

Furthermore, a first dielectric layer 61 is further provided between the substrate 1 and the first semiconductor layer 21, and a second dielectric layer 62 is further provided between the substrate 1 and the second semiconductor layer 22.

Optionally, the first semiconductor layer 21 is a first doped polycrystalline silicon layer or a first doped amorphous silicon layer deposited on the back surface of the substrate 1. The second semiconductor layer 22 is a second doped polycrystalline silicon layer or a second doped amorphous silicon layer deposited on the second dielectric layer 62.

Optionally, the first passivation layer 51 is one or more layers of aluminum oxide layer, silicon oxide layer, silicon oxynitride layer, or silicon nitride layer. The second passivation layer 52 is one or more layers of aluminum oxide layer, silicon oxide layer, silicon oxynitride layer, or silicon nitride layer. The third passivation layer 53 is one or more layers of aluminum oxide layer, silicon oxide layer, silicon oxynitride layer, or silicon nitride layer. The fourth passivation layer 54 is one or more layers of aluminum oxide layer, silicon oxide layer, silicon oxynitride layer, or silicon nitride layer.

Optionally, the first dielectric layer 61 is at least one of a silicon oxide layer, an amorphous silicon layer, a polycrystalline silicon layer, and a silicon carbide layer. The second dielectric layer 62 is at least one of a silicon oxide layer, an amorphous silicon layer, a polycrystalline silicon layer, and a silicon carbide layer.

As an alternative embodiment, the solar cell is a passivated contact solar cell. The solar cell comprises:

the substrate 1;

a first semiconductor layer 21 and a first electrode 31 sequentially provided on the light receiving surface of substrate 1 with the first semiconductor layer 21 and the substrate 1 having different conductivity type, respectively; and a dielectric layer, a second semiconductor layer 22, and a second electrode 32 sequentially provided on the back surface of substrate 1.

Among them, the first electrode 31 is in ohmic contact with the first semiconductor layer 21, and the second electrode 32 is in ohmic contact with the second semiconductor layer 22.

Furthermore, the solar cell further comprises:

a fifth passivation layer provided on a side surface of the first semiconductor layer 21 facing away from the substrate 1;

a sixth passivation layer provided on a side surface of the second semiconductor layer 22 facing away from the substrate 1; and a seventh passivation layer provided on the side of substrate 1.

Since the shared prismatic edges c and/or shared corners d of the light receiving surface (or back surface) and the side surface of the substrate 1 is provided with the above-described multiple-pyramid shared bodies 11 having shared surfaces, and third pyramid structures 12 are provided on the side surfaces, improvement of results of adhesion of the seventh passivation layer provided on the side surfaces to the substrate 1 is facilitated, which in turn enhances passivation performance of the seventh passivation layer.

Optionally, the first semiconductor layer 21 is formed by thermal diffusion of doped elements to the substrate 1, or the first semiconductor layer 21 is a first doped polycrystalline silicon layer or a first doped amorphous silicon layer deposited on the light receiving surface of the substrate 1. The second semiconductor layer 22 is a second doped polycrystalline silicon layer or a second doped amorphous silicon layer deposited on the dielectric layer.

Optionally, the fifth passivation layer is one or more of aluminum oxide layer, silicon oxide layer, silicon oxynitride layer, or silicon nitride layer. The sixth passivation layer is one or more layers of aluminum oxide layer, silicon oxide layer, silicon oxynitride layer, or silicon nitride layer. The seventh passivation layer is one or more layers of aluminum oxide layer, silicon oxide layer, silicon oxynitride layer, or silicon nitride layer.

Optionally, the dielectric layer is at least one of a silicon oxide layer, an amorphous silicon layer, a polycrystalline silicon layer, and a silicon carbide layer.

The present embodiment of the present application also provides a preparation method for the above-mentioned solar cell. It can be understood that the solar cell of the embodiments of the present application can also be obtained through other preparation methods, and is not limited by the present application.

As an example, preparation of a back contact solar cell with the above-mentioned substrate will be described as follows. The embodiments of the present application provide a preparation method for a back contact solar cell, comprising the following steps:

a first polishing: a mixed solution of alkali and additives is used to pre-treat the silicon substrate, to eliminate line marks and oil contamination of surfaces, wherein the alkaline solution contains NaOH or KOH at a concentration of 0.6% wt to 4.8% wt, and additives at a concentration of 0.9% wt to 1.1% wt; a polishing temperature is at 50 to 90° C., and a polishing time is 400-900 seconds. When the polishing is completed, a mixed solution of hydrofluoric acid and hydrochloric acid is then used for deep cleaning, followed by thorough rinsing by deionized water, and finally drying;

a first coating:

LPCVD is used to sequentially deposit a silicon oxide layer with a thickness of 0.6 nm~2.8 nm as the first dielectric layer and an intrinsic amorphous silicon layer with a thickness of 120 nm~280 nm on the back surface of a silicon substrate at deposition temperature of 540° C.~660° C. Preferably, a 2 nm silicon oxide layer and a 250 nm intrinsic amorphous silicon layer are deposited;

by doping the intrinsic amorphous silicon layer through thermal diffusion process, the intrinsic amorphous silicon layer is transformed into the first doped crystalline silicon layer. The doping type is opposite to that of the silicon substrate. For example, if the silicon substrate is a N-type silicon substrate, boron source is doped into the intrinsic amorphous silicon layer through the thermal diffusion process to obtain the boron doped crystalline silicon layer as the first doped crystalline silicon layer. After doping is completed, a layer of first doped silicon oxide mask is formed on a surface of the first doped crystalline silicon layer, and a thickness of the first doped silicon oxide mask is 18-62 nm;

a first patterning: on a side of the back surface of the silicon substrate, the first doped silicon oxide mask is opened by laser etching until the first doped crystalline silicon layer is exposed, and a patterned first doped silicon oxide mask is obtained; wherein conditions for laser etching include: (1) type of laser includes at least one of nanoseconds, picoseconds, and femtoseconds; (2) wavelength of laser can be selected from infrared laser, visible light laser, or ultraviolet laser; (3) laser energy is controlled within 30-3000 mJ/cm$^2$; (4) wavelength range is between 700-1000 nm; (5) shape of laser spot includes circular, square, rectangular, or elliptical;

a second polishing: alkaline solution is used to etch and remove the first doped crystalline silicon layer and the first dielectric layer corresponding to a laser irradiated area until the silicon substrate is exposed (during this process, underlying film layers are preserved due to protection of the patterned doped silicon oxide mask). Among them, the alkaline solution contains NaOH or KOH with a concentration of 0.5% wt~5% wt, and additives with a concentration of 0.9% wt~1.1% wt mainly composed of sodium gluconate, protectants and brighteners. Among them, process temperature is 65-85° C., and polishing time is 300-800 seconds. After the second polishing is completed, alkaline washing with alkaline solution and water washing are carried out sequentially, and then acid washing with acid solution, water washing and drying are carried out.

A second coating: PECVD process is used to sequentially deposit a second dielectric layer with a thickness of 1.5 nm, a second doped amorphous silicon layer with a thickness of 200 nm, and a second doped silicon oxide mask on a side of the back surface. Annealing is carried out to transform the second doped amorphous silicon layer into the second doped polycrystalline silicon layer, wherein the second doped silicon oxide mask is of a thickness of 20 nm to 60 nm.

A second patterning: on a side of the back surface, a large portion of the second doped silicon oxide mask is removed by laser etching (a removed area includes: an area corresponding to the first doped crystalline silicon layer and an area used to form a trench area) to expose the second doped polycrystalline silicon layer; wherein conditions of laser etching include: (1) type of laser comprises at least one of nanoseconds, picoseconds, and femtoseconds, and (2) wavelength of laser can be chosen from infrared laser, visible light laser, or ultraviolet laser; (3) laser energy is controlled within 30-3000 mJ/cm$^2$; (4) wavelength range is between 700-1000 nm; and (5) spot size of laser is (20-400) μm* (20-400) μm.

Acid polishing and texturing:

polish the light receiving surface with acid; a chain-type machine is used as a machine station for acid polishing, a mixed acid solution of hydrofluoric acid, nitric acid, and sulfuric acid is used to corrode and remove the mask layer on the light receiving surface. At the same time, due to capillary adsorption effect during the acid polishing process, the chemical solution climbing will also react with and corrode the mask layer. Therefore, the acid polishing removes all the coating layers and doped silicon oxide masks on the light receiving surface and side surfaces, exposing the substrate of the light receiving surface and side surfaces. During this process, a water film is sprayed on the back surface before acid polishing to protect the film layers on the back surface and ensure that the back surface will not be corroded during the acid polishing process on the light receiving surface and side surfaces;

texturing: during texturing process, due to differences in rate of corrosion by alkaline solution between the surface(100) and the surface (111) of a silicon wafer, a third pyramid structure and a fourth pyramid structure are formed on the side surface and the light receiving surface, respectively, and a multiple-pyramid shared body is formed at the area where the light receiving surface and the side surface are adjacent; wherein a alkaline solution and additives for texturing is used for texturing. The alkaline solution is KOH or NaOH, and its concentration is controlled within a range of 1-5 wt %. Concentration of additives for texturing is 0.5-2 wt %, and their main components include carboxymethyl cellulose, sodium lignosulfonate, defoamer and so on. In the additives for texturing, carboxymethyl cellulose accounts for 1 wt %; sodium lignosulfonate accounts for 1 wt %, and defoamer accounts for 0.5 wt %. Temperature for texturing operation is set at 60-85° C., and texturing time is 300-800 seconds.

Alkali washing, water washing, acid washing, water washing and drying: after texturing is completed, alkali washing is performed using a mixed solution of KOH and $H_2O_2$ or NaOH and $H_2O_2$ to remove substances of residual additives from the texturing process, and while the silicon wafers are washed. Acid washing removes the first doped silicon oxide mask and the second doped silicon oxide mask on the back surface by use of HF solution.

a third coating: PECVD is used to deposit an aluminum oxide layer on the light receiving surface, side surfaces and the back surface, with a thickness of 4 nm. Then, silicon nitride layers are deposited separately to provide effects of passivation and decrease of reflection; wherein, the silicon nitride layer on the light receiving surface is 75 nm, the silicon nitride layer on the back surface is 92 nm, and the silicon nitride layer on the side surface is 167 nm; and screen printing and sintering to form electrodes.

Figure 8:
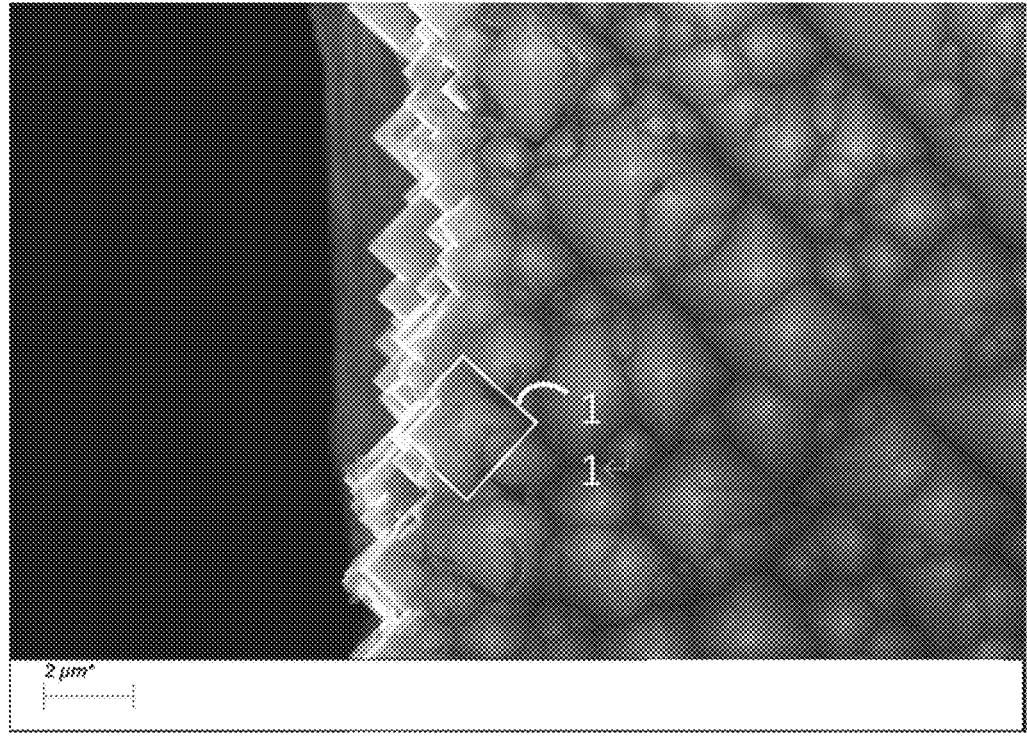
FIG. 8 is a SEM view of a multiple-pyramid shared body provided on a shared prismatic edge in an embodiment of the present application.
Figure 9:
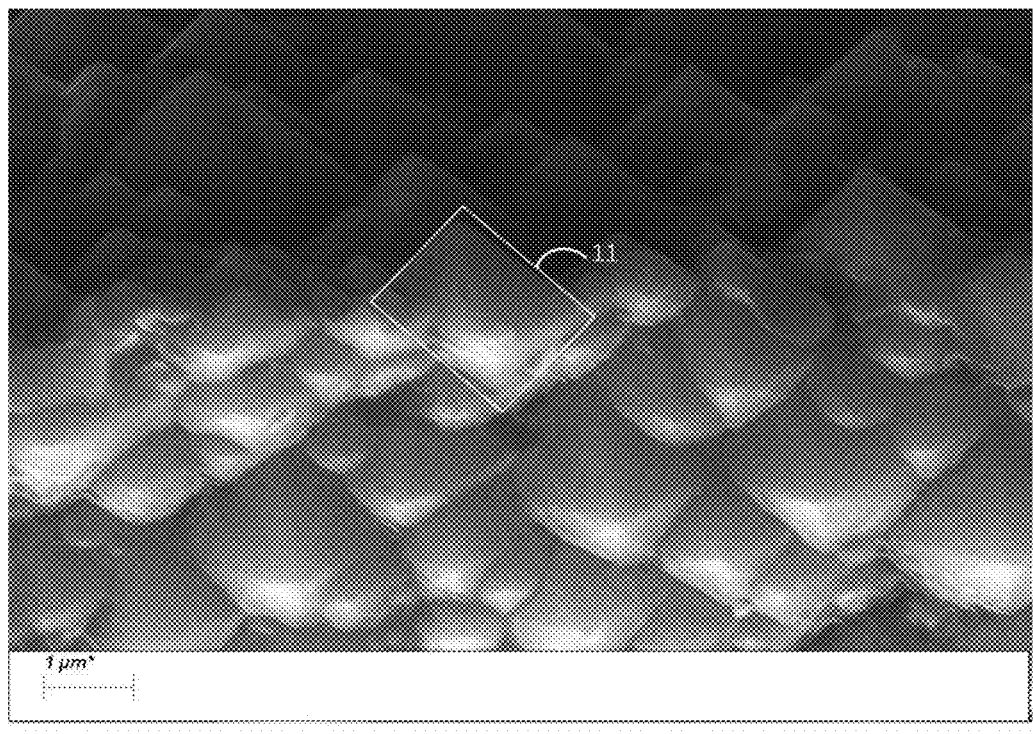
FIG. 9 is an SEM view of a multiple-pyramid shared body provided on a shared prismatic edge of an embodiment of the present application.

In the solar cell obtained by the above method, the light receiving surface of the substrate are provided with several fourth pyramid structures, the side surfaces are provided with several third pyramid structures, and several multiple-pyramid shared bodies are provided on the shared prismatic edges where the light receiving surface and the side surfaces are adjacent. In conjunction with images from scanning electron microscopy in FIG. 8 and FIG. 9, the multiple-pyramid shared bodies, especially those viewed from angles towards the cut side surface are shown. The images from scanning electron microscopy in FIGS. 8 and 9 are obtained using a ZEISS (Zeiss, Germany) scanning electron microscope. Observation conditions in FIG. 8 include: acceleration voltage of 15.00 kV in InLens mode, working distance of 6.8 mm, and magnification of 5.00 KX. Observation conditions in FIG. 9 include: acceleration voltage of 15.00 kV in InLens mode, working distance of 11.7 mm, and magnification of 10.00 KX.

Furthermore, in the preparation method of the embodiments of the present application, slicing of a semi-finished solar cell can be performed before the step for texturing, and then the texturing and subsequent operations can be carried out after the slicing. By way of example, in conjunction with the preparation method introduced earlier, the slicing can be performed after the acid polishing of the light receiving surface and before the texturing. Slicing can also be performed after the second patterning step and before the step of acid polishing the light receiving surface. By slicing the semi-finished solar cell, at least one side surface of the substrate can be a cut side. In a final solar cell, multiple-pyramid shared bodies are provided on the shared prismatic edges where the light receiving surface and side surface are adjacent; multiple pyramid shared bodies are further provided on the shared prismatic edges where the side surfaces are adjacent; and triple-pyramid shared bodies are provided on the shared corners where the light receiving surface and two side surfaces are adjacent.

In a second aspect, the embodiments of the present application also provides a photovoltaic module comprising the solar cell described in the first aspect.

Below, explanation will be provided together with more specific examples and experimental data.

Embodiment 1

This embodiment provides a solar cell comprising:

a N-type silicon substrate;

a first dielectric layer, a first semiconductor layer, and a first electrode are sequentially provided on a -type conductive region of the back surface of the substrate; wherein the first semiconductor layer is a boron doped polycrystalline silicon layer;

a second dielectric layer, a second semiconductor layer, and a second electrode are sequentially provided on a P-type conductive region of the back surface of the substrate; wherein the second semiconductor layer is a phosphorus doped polycrystalline silicon layer;

wherein, the first semiconductor layer and the second semiconductor layer are alternately arranged in an interdigitated manner, and there is an isolation region between the first semiconductor layer and the second semiconductor layer;

a first passivation layer provided on a surface of the first semiconductor layer facing away from the back surface;

a second passivation layer provided on a surface of the second semiconductor layer facing away from the back surface; wherein the first passivation layer and the second passivation layer are of a structure of a whole layer, the first electrode penetrates the first passivation layer and forms ohmic contact with the first semiconductor layer, and the second electrode penetrates the second passivation layer and forms ohmic contact with the second semiconductor layer;

a third passivation layer provided on the light receiving surface of the substrate;

a fourth passivation layer provided on the side surfaces of the substrate.

Among them, the substrate is provided adjacent light receiving surfaces and side surfaces, with several third pyramid structures on the side surfaces and several fourth pyramid structures on the light receiving surfaces; and multiple-pyramid shared bodies with shared surfaces further provided on the shared prismatic edge where the light receiving surfaces and the side surfaces are adjacent.

When viewed in the direction towards a side surface, the multiple-pyramid shared body includes a first pyramid structure by enclosed by several first triangular surfaces and several third triangular surfaces. When viewed in the direction towards the light receiving surface, the multiple-pyramid shared body includes a second pyramid structure enclosed by several second triangular surfaces and several third triangular surfaces, wherein the third triangular surface is a shared surface, and triangular surfaces in the first triangular surface, the second triangular surface, and the third triangular surface are in a shape of a triangle or a quasi-triangular.

In an orthographic projection of a side surface, the first pyramid structure is provided with a first diagonal with length of L1, which ranges from 0.1 μm to 7 μm, in the orthographic projection of the light receiving surface, the second pyramid structure is provided a second diagonal with length of L2, which ranges from 0.1 μm~7 μm, and in any of the multiple-pyramid shared bodies, $0.5 \leq L1/L2 \leq 2$.

Among them, in a direction perpendicular to the side surface, the first pyramid structure is provided with a first height of H1, which ranges from 0.1 μm~3 μm, in a direction perpendicular to the light receiving surface, the second pyramid structure is provided with a second height of H2, which ranges from 0.1 μm to 3 μm, and in any of multiple-pyramid shared bodies, $0.5 \leq H1/H2 \leq 2$.

Among them, for the region of the length of 100 μm corresponding to the shared prismatic edge, the number of multiple-pyramid shared bodies is greater than or equal to one.

Among them, in a orthographic projection of the side surface, the third pyramid structure is provided with a diagonal with length of L3, which ranges from 0.1 μm~7 μm, and $0.5 \leq L3/L1 \leq 2$. In a orthographic projection of the light receiving surface, the fourth pyramid structure is provided with a fourth diagonal with length of L4, which ranges from 0.1 μm~7 μm, and $0.5 \leq L4/L2 \leq 2$.

Among them, in a direction perpendicular to the side surface, the third pyramid structure is provided with a third height of H3, which ranges from 0.1 μm~3 μm, and $0.5 \leq H3/H1 \leq 2$. In a direction perpendicular to the light receiving surface, the fourth pyramid structure is provided with a fourth height of H4, which ranges from 0.1 μm to 3 μm and $0.5 \leq H4/H2 \leq 2$.

Embodiment 2

The differences between this embodiment and embodiment 1 lie in that the solar cell is a solar cell in sliced piece, and a cut side surface is formed at cut positions.

Among them, in addition to the double-pyramid shared bodies having shared surfaces provided on the shared prismatic edges where the cut side surfaces and the light-receiving surfaces are adjacent, on the shared prismatic edges where the cut side surface and other side surfaces that are adjacent, and on the substrate, the triple-pyramid shared bodies are further provided on the shared prismatic corner of the three surfaces of the cut side surface, the light receiving surface, and the side surface adjacent to the cut side surface, and on the substrate.

Comparison Example 1

The difference between this comparison example and the embodiment 1 only lies in that the light receiving surface of the solar cell has a fourth pyramid structure, and the side surface are not provided with a third pyramid structure or a multiple-pyramid shared body.

Comparison Example 2

The difference between this comparison example and the embodiment 1 only lies in that the side surface of the solar cell has a third pyramid structure, and the light receiving surface of the solar cell has a fourth pyramid structure, without a multiple-pyramid shared body.

Performance Testing

Use Halm testing and sorting equipment to conduct performance tests on open circuit voltage, fill factor, photovoltaic conversion efficiency, and other aspects. Halm machines are devices that simulate sunlight and are equipped with electronic loads, data acquisition and calculation devices to test electrical performance of photovoltaic devices (including solar cells). The calibrated light intensity of the solar cell used for control of testing is $1000 \pm 5$ W/m$^2$.

Test results are shown in Table 1 below.

TABLE 1

| Test Results of Embodiments 1 to 2 and Comparison examples 1 to 2 | | | | |
|---|---|---|---|---|
| | open circuit voltage (V) | fill factor (%) | short-circuit current (A) | photovoltaic conversion efficiency (%) |
| Embodiment 1 | 0.7346 | 81.98 | 8.228 | 25.84 |
| Embodiment 2 | 0.7367 | 81.72 | 8.243 | 25.87 |
| Comparison example 1 | 0.7353 | 81.43 | 8.234 | 25.71 |
| Comparison example 2 | 0.7355 | 81.34 | 8.213 | 25.72 |

Comparing the test results of Embodiment 1 with Comparison Examples 1 and 2, it can be seen that when pyramid structures are provided on adjacent surfaces of the substrate, and multiple-pyramid shared bodies having shared surfaces are provided on the shared prismatic edges of the adjacent surfaces, the photovoltaic conversion efficiency of the solar cell is improved by more than 0.1%. In the field of solar cells, effect of improvement of over 0.1% means that higher practical significance is obtained when assembling solar cells into photovoltaic modules for application. As a result, the solar cell of the present embodiment is conductive to further improving performance of the cells due to presence of multiple-pyramid shared bodies.

Furthermore, comparing Embodiment 1 and Embodiment 2, it can be seen that after slicing the cells, the multiple-pyramid shared bodies formed at cut positions include both double-pyramid shared bodies and triple-pyramid shared bodies. Features of the structure are beneficial for further improving of performance of the solar cells.

The above provides a detailed introduction to the technical solutions disclosed in the embodiments of this application. Specific examples are used herein to explain the principles and implementation methods of this application. The above description of embodiments only intends to help understanding of the technical solution and core inventive points of this application. At the same time, variations can be made by a person skilled in the art in the embodiments and application scope based on ideas of this application. Therefore, content of this specification should not be construed as limiting to this application.

What is claimed is:

1. A solar cell comprising:
   a substrate provided with a light-receiving surface, a back surface, and side surfaces adjacent to the light-receiving surface and the back surface;
   wherein on the light-receiving surface, the side surfaces, and shared corners where the light-receiving surface and the side surfaces are adjacent to each other, the substrate is provided with multiple-pyramid shared bodies, each multiple-pyramid shared body of the multiple-pyramid shared bodies having a shared surface;

wherein when viewed in the direction towards a side surface of the side surfaces, the multiple-pyramid shared body comprises a first pyramid structure formed by enclosing several first triangular surfaces and several third triangular surfaces; and when viewed in the direction towards the light-receiving surface, the multiple-pyramid shared body comprises a second pyramid structure formed by enclosing several second triangular surfaces and the several third triangular surfaces; and wherein a third triangular surface of the several third triangular surfaces is the shared surface, and the triangular surfaces in the first triangular surfaces, the second triangular surfaces and the third triangular surfaces are in a shape of a triangle or a quasi-triangle;

the solar cell further comprises: a first semiconductor layer and a first electrode sequentially provided in a P-type conductive region on the back surface of the substrate; and a second semiconductor layer and a second electrode sequentially provided in a N-type conductive region on the back surface of the substrate; wherein, the first semiconductor layer and the second semiconductor layer are alternately arranged in an interdigitated manner, and there is an isolation region between the first semiconductor layer and the second semiconductor layer; a passivation layer located on a surface of the first semiconductor layer facing away from the substrate, and located on the side surfaces of the substrate; the first electrode penetrates the passivation layer and forms an ohmic contact with the first semiconductor layer, the second electrode penetrates the passivation layer and forms an ohmic contact with the second semiconductor layer.

2. The solar cell of claim 1, wherein the multiple-pyramid shared body is a double-pyramid shared body.

3. The solar cell of claim 1, wherein the multiple-pyramid shared body is a triple-pyramid shared body.

4. The solar cell of claim 1, wherein the solar cell is a sliced cell, the substrate is provided with a cut side surface, and the side surface of the side surfaces of the substrate includes the cut side surface; and/or the light-receiving surface and the side surfaces of the substrate are perpendicular to each other.

5. The solar cell of claim 1, wherein in orthographic projections of each side surface of the side surfaces, the first pyramid structure is provided with a first diagonal with length of L1, and $0.1 \ \mu m \leq L1 \leq 7 \ \mu m$;

in an orthographic projection of the light-receiving surface, the second pyramid structure is provided with a second diagonal with length of L2, and $0.1 \ \mu m \leq L2 \leq 7 \ \mu m$; and in the multiple-pyramid shared bodies, $0.5 \leq L1/L2 \leq 2$.

6. The solar cell of claim 1, wherein in a direction perpendicular to each side surface, the first pyramid structure is provided with a first height of H1, and $0.1 \ \mu m \leq H1 \leq 3 \ \mu m$;

in a direction perpendicular to the light-receiving surface, the second pyramid structure is provided with a second height of H2, and $0.1 \ \mu m \leq H2 \leq 3 \ \mu m$; and in the multiple-pyramid shared bodies, $0.5 \leq H1/H2 \leq 2$.

7. The solar cell of claim 1, wherein each multiple-pyramid shared body of the multiple-pyramid shared bodies arranged on a respective shared corner of the shared corners is arranged along a length direction of the respective shared corner; and wherein each respective shared corner is provided with a middle region and edge regions located on both sides of the middle region; the length of the diagonal of the multiple-pyramid shared body located in the middle region is less than that of diagonal of the multiple-pyramid shared body located in the edge regions; the height of the multiple-pyramid shared body located in the middle region is less than that of the multiple-pyramid shared body located in the edge regions; and/or, for a region of the length of 100 μm corresponding to the respective shared corner, the number of the multiple-pyramid shared bodies is greater than or equal to 1.

8. The solar cell of claim 7, wherein for a region of length of 100 μm corresponding to the respective shared corner, the number of the multiple-pyramid shared bodies is at least 10.

9. The solar cell of claim 1, wherein a plurality of third pyramid structures are provided on each of the side surfaces, and a plurality of fourth pyramid structures are provided on the light-receiving surface.

10. The solar cell of claim 9, wherein in orthographic projections of each side surface of the side surfaces, the first pyramid structure is provided with a first diagonal with length of L1, and $0.1 \ \mu m \leq L1 \leq 7 \ \mu m$, and the third pyramid structure is provided with a third diagonal with length of L3, and $0.1 \ \mu m \leq L3 \leq 7 \ \mu m$, and $0.5 \leq L3/L1 \leq 2$; and wherein in an orthographic projection of the light-receiving surface, the second pyramid structure is provided with a second diagonal with length of L2, and $0.1 \ \mu m \leq L2 \leq 7 \ \mu m$, and the fourth pyramid structure is provided with a fourth diagonal with length of L4, and $0.1 \ \mu m \leq L4 \leq 7 \ \mu m$, and $0.5 \leq L4/L2 \leq 2$, wherein in a direction perpendicular to the side surfaces, the first pyramid structure is provided with a first height of H1, and $0.1 \ \mu m \leq H1 \leq 3 \ \mu m$, and the third pyramid structure is provided with a third height of H3, and $0.1 \ \mu m \leq H3 \leq 5 \ \mu m$, and $0.5 \leq H3/H1 \leq 2$; and wherein in a direction perpendicular to the light-receiving surface, the second pyramid structure is provided with a second height of H2, and $0.1 \ \mu m \leq H2 \leq 3 \ \mu m$, and the fourth pyramid structure is provided with a fourth height of H4, and $0.1 \ \mu m \leq H4 35 \ \mu m$, and $0.5 \leq H4/H2 \leq 2$.

11. A photovoltaic module comprising the solar cell according to claim 1.

\* \* \* \* \*